United States Patent [19]

Moriya et al.

[11] Patent Number: 4,650,698
[45] Date of Patent: Mar. 17, 1987

[54] METHOD OF FORMING A THIN FILM OF A METAL OR METAL COMPOUND ON A SUBSTRATE

[75] Inventors: Takahiko Moriya, Yokosuka; Saburo Nakada, Kawasaki, both of Japan

[73] Assignee: Kabushiki Kaisha Toshiba, Kawasaki, Japan

[21] Appl. No.: 780,242

[22] Filed: Sep. 26, 1985

Related U.S. Application Data

[63] Continuation of Ser. No. 627,480, Jul. 3, 1984, abandoned.

[30] Foreign Application Priority Data

Aug. 19, 1983 [JP] Japan .................................. 58-150978

[51] Int. Cl.⁴ .......................... B05D 7/22; C23C 16/06
[52] U.S. Cl. .................................... 427/237; 427/250; 427/253; 427/255; 427/255.2; 427/255.7; 427/404; 427/419.7
[58] Field of Search ............... 427/237, 250, 252, 253, 427/255, 255.2, 255.1, 255.7, 404, 419.7, 126.1, 124, 93, 419.1, 248.1

[56] References Cited

U.S. PATENT DOCUMENTS

| | | | |
|---|---|---|---|
| 2,884,894 | 5/1959 | Ruppert et al. | 427/255 |
| 4,180,596 | 12/1979 | Crowder et al. | 427/255 |
| 4,391,846 | 7/1983 | Raymond | 427/255 |

FOREIGN PATENT DOCUMENTS

| | | | |
|---|---|---|---|
| 1086510 | 8/1960 | Fed. Rep. of Germany | 427/250 |
| 56-155589 | 12/1981 | Japan | 427/250 |
| 940971 | 11/1963 | United Kingdom | 427/250 |
| 940972 | 11/1963 | United Kingdom | 427/250 |

*Primary Examiner*—Sadie L. Childs
*Attorney, Agent, or Firm*—Oblon, Fisher, Spivak, McClelland & Maier

[57] ABSTRACT

A method of forming with good reproducibility a high-quality thin film of a metal or metal compound by a vapor growth method on a substrate placed in a quartz reaction tube which has the steps of, prior to the formation of the thin film forming an intermediate film of a material having good adhesion with both quartz, and the metal or metal compound on the inner wall of the reaction tube, and forming a film of the metal or metal compound for the thin film on the intermediate film.

8 Claims, 5 Drawing Figures

METHOD OF FORMING A THIN FILM OF A METAL OR METAL COMPOUND ON A SUBSTRATE

This application is a continuation of application Ser. No. 627,480, filed July 3, 1984, abandoned.

BACKGROUND OF THE INVENTION

The present invention relates to a method of forming a high-quality thin film of a metal or metal compound by vapor growth.

As one conventional vapor growth apparatus, a diffusion furnace type low-pressure vapor growth apparatus is known wherein a plurality of substrates is aligned along the longitudinal direction of a reaction tube, and a thin film is deposited by vapor growth on each of the substrates. The reaction tube of this apparatus comprises quartz. This quartz reaction tube can be effectively used to form a polycrystalline silicon film and a silicon nitride film since quartz has a high purity and the tube can easily be cleaned. However, the quartz reaction tube has the following problem when a metal or metal compound film is formed.

For example, when a tungsten (W) film is formed on a substrate surface by using a gas mixture of tungsten hexafluoride ($WF_6$) and hydrogen as a feed gas, the tungsten film is deposited on the substrate surface and the inner wall surface of the quartz reaction tube. However, adhesion between the quartz and tungsten is poor. As the number of growth operations is increased, the tungsten film deposited on the inner wall of the quartz reaction tube is separated. Pieces of the separated tungsten film adhere to the substrate surface. As a result, granular defects occur on the substrate surface. In addition to this disadvantage, the dissociation speed or rate of $WF_6$ at the quartz surface is lower than that at the tungsten film surface. Thus, the concentration of $WF_6$ reaching the substrate surface changes in accordance with the area of the tungsten film formed on the inner surface of the quartz tube. For this reason, a tungsten film having a desired film thickness cannot be formed on the substrate surface with good reproducibility.

SUMMARY OF THE INVENTION

It is an object of the present invention to provide a method of forming a thin film, wherein a high-quality thin metal or metal compound film without granular defects is formed on a substrate with good reproducibility.

According to the present invention, there is provided a method of forming a thin film, wherein a substrate is placed in a quartz reaction tube and a thin metal or metal compound film is formed on the substrate by a vapor growth method. The main feature of the method of the present invention lies in the fact that, prior to formation of the thin film, an intermediate film of a material having good adhesion with quartz and the metal or metal compound is formed on the inner wall of the reaction tube and a film of the metal or metal compound for the thin film is formed on the intermediate film.

The material having good adhesion with both quartz, and the metal or metal compound comprises a silicon or metal silicide material. The silicon material can be monocrystalline silicon, polycrystalline silicon or amorphous silicon. The metal silicide can be tungsten silicide, molybdenum silicide or titanium silicide.

The metal or metal compound of the thin film formed according to the present invention can be selected from W, Mo, Ta, Ti, any silicides thereof, and Al.

It should be understood that the term "adhesion" means that a given film has good adhesion at a predetermined temperature, and that the given film has good adhesion even if the temperature changes (i.e., the thermal expansion coefficient of the given film is similar to that of a film to be adhered thereto).

When it is difficult to select a material having good adhesion with both quartz, and the metal or metal compound, a two-layer structure can be selected as the intermediate film, wherein first and second films thereof have good adhesion with quartz, and the metal or metal compound, respectively. For example, a combination of the first film, the second film, and a film to be formed on the intermediate film can comprise silicon, titanium, and aluminum.

It should be noted that the substrate on which the metal or metal compound film to be formed comprises Si, Ge, GaAs or sapphire.

DETAILED DESCRIPTION OF THE PREFERRED EMBODIMENT

A method of forming a thin film according to an embodiment of the present invention will be described with reference to the accompanying drawings.

Figure 1:
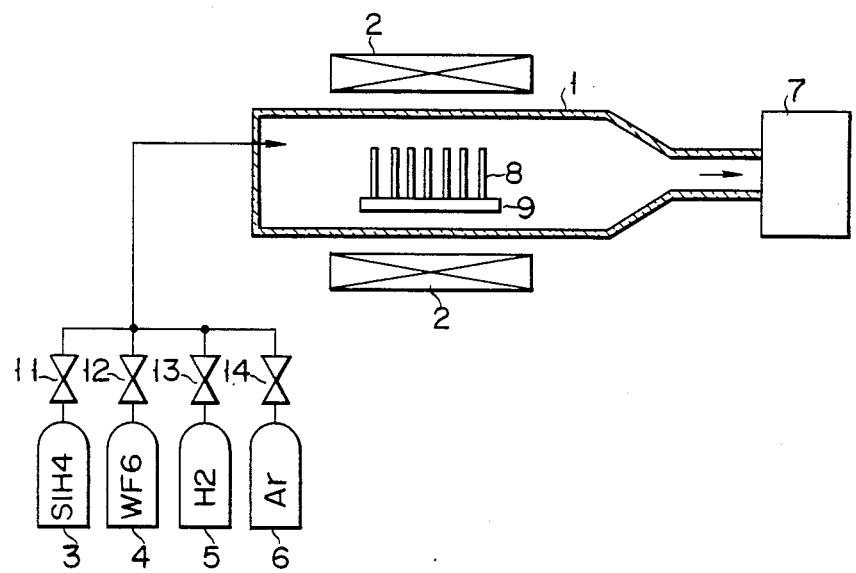
FIG. 1 is a schematic representation of a vapor growth apparatus according to an embodiment of the present invention.

FIG. 1 is a schematic representation of a vapor growth apparatus for the method of the present invention. Referring to FIG. 1, reference numeral 1 denotes a quartz reaction tube. A heater 2 is disposed around the quartz reaction tube 1. Predetermined gases can be supplied to the reaction tube 1 from gas cylinders 3, 4, 5 and 6 which respectively contain $SiH_4$, $WF_6$, $H_2$ and Ar gases. The gas or gas mixture is discharged by a vacuum pump 7 from the reaction tube 1. A quartz boat 9 for supporting a plurality of substrates 8 on which thin films are respectively formed is disposed in the reaction tube 1. Reference numerals 11, 12, 13 and 14 respectively denote valves which are selectively opened or closed to supply a predetermined gas or gases to the reaction tube 1.

Figure 2A:
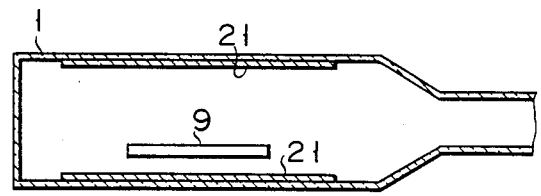
FIGS. 2A to 2C are sectional views for explaining the steps in forming a W film.
Figure 2B:
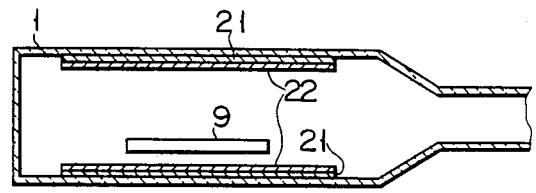

An example will be described with reference to FIGS. 2A to 2C wherein a tungsten film is formed by vapor growth on a silicon substrate placed in the apparatus described above.

The cleaned quartz reaction tube 1 and the cleaned quartz boat 9 were placed in a furnace (not shown) and were heated to a temperature of 550° to 700° C. Subsequently, the reaction tube 1 was evacuated, and $SiH_4$ gas was supplied to the reaction tube 1 at a flow rate of 100 cc/min. while the reaction tube 1 was kept at a low pressure of 0.05 Torr. Silicon layers 21 were deposited on the inner wall of the reaction tube 1 and the surface of the boat 9 to a thickness of, for example 0.5 to 2 μm, as shown in FIG. 2A. In this case, almost the entire area of the inner wall of the reaction tube 1 (excluding the regions of both ends thereof which were kept at a low temperature) was covered with the silicon layer 21. It should be noted that since the silicon layer 21 was not formed on the portion of the inner wall of the reaction tube 1 under the boat 9, the quartz surface may be exposed upon movement of the boat 9. In order to prevent this, the silicon layer 21 is preferably formed on the inner wall of the reaction tube 1 before the boat 9 is placed in the tube 1. Then, the boat 9 is placed in the reaction tube 1, and another silicon layer 21 is formed on the surface of the boat 9. It is preferred that this process be also applied in the subsequent W film formation process.

$WF_6$ and $H_2$ gases were respectively supplied to the reaction tube 1 at flow rates of 10 cc/min. and 200 cc/min., while the inside of the furnace was cooled to a temperature of 300° to 500° C. and was kept at a low pressure of 0.1 Torr. W films 22 of 0.1 to 1 $\mu$m thickness were respectively formed on the silicon layer 21 (having a temperature of about 200° C.) formed on the inner wall of the reaction tube 1 and the surface of the boat 9, as shown in FIG. 2B.

Figure 2C:
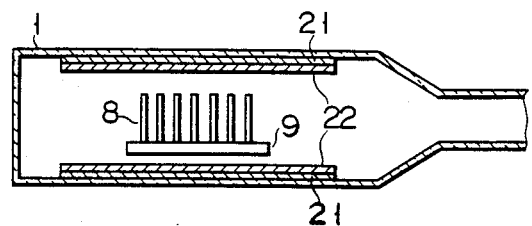

Thereafter, fifty silicon substrates 8 were set on the boat 9 having a silicon layer thereon, which was then placed in the reaction tube 1, as shown in FIG. 2C. In the same manner as described above, $WF_6$ and $H_2$ gases were respectively introduced into the reaction tube 1, thereby forming W films on the silicon substrates 8. Each of the W films has a thickness of 0.3 $\mu$m and a very low particulate defect density at the film surface. In the conventional method, the vapor growth operation is repeated 10 times. Thus, a W film having a thickness of 0.3 $\mu$m was vapor-grown on each silicon substrate surface, and the substrate having the W film was replaced with a new silicon substrate which was then deposited with a W film having a thickness of 0.3 $\mu$m, and so on. In this case, the particulate defect density of the W film surface was 20 particles/$cm^2$. However, in the method of the present invention, when the vapor growth operation was repeated 10 times in the same manner as in the conventional method, the particulate defect density was only 0.2 particles/$cm^2$ or less.

According to the conventional method, the particulate defect density is increased when the vapor growth operation number is increased. However, according to the method of the present invention, substantially no increase in vapor particulate defect density occurs. For example, when the vapor growth operation was repeated 50 times, the particulate defect density was still only 0.3 particles/$cm^2$. In addition, the reproducibility of the film thickness after this repetition of vapor growth operation still fell within the range of ±5%.

Figure 3:
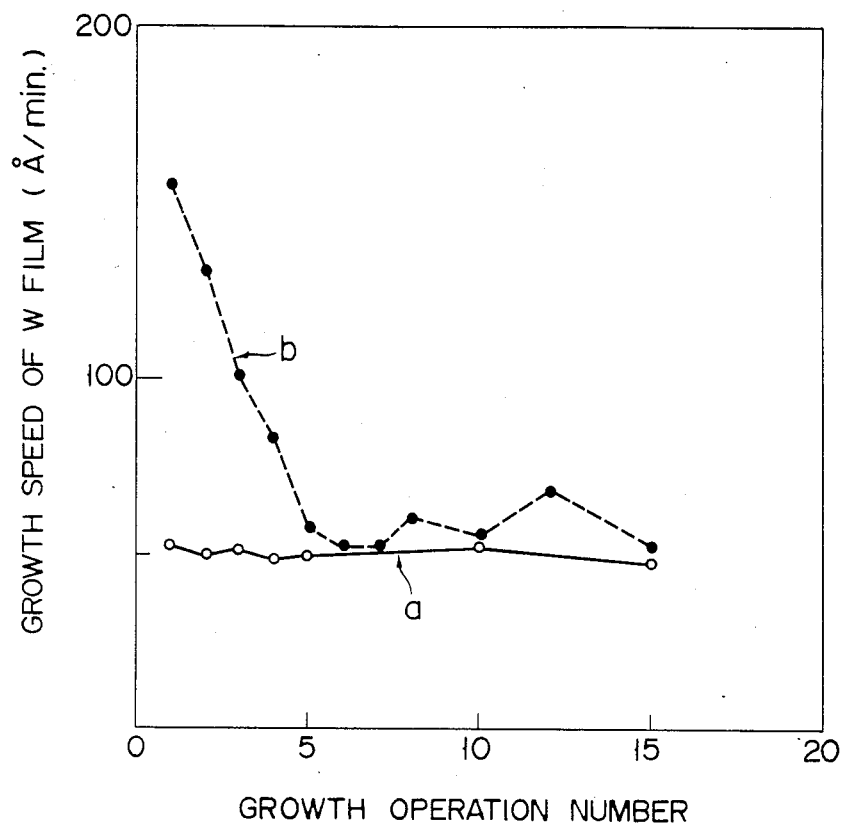
FIG. 3 is a graph comparing changes in the growth rate or speed of the W film as a function of the growth operation number in the method of the present invention as opposed to those of the conventional method.

FIG. 3 is a graph comparing the growth speed of the W film as a function of the number of times that vapor growth is repeated according to the method of the present invention, with that according to the conventional method. A curve a in FIG. 3 indicates the results of the present invention, and a curve b in FIG. 3 indicates those of the conventional method. FIG. 3 shows that a constant growth speed is obtained irrespective of changes in the number of times of the vapor growth according to the method of the present invention.

The present invention is not limited to the particular embodiment described above. In the embodiment described above, silicon is used to form the intermediate film on the inner wall of the quartz reaction tube, and the W film is vapor-grown on the substrate. However, the present invention is not limited to the case described above. For example, a metal silicide, or a two-layer structure may be used as the intermediate film, and a material such as W, Mo, Ta, Ti, any metal silicides thereof, or Al may be vapor-grown on the substrate to obtain the same effect as in the above embodiment.

The vapor growth apparatus is not limited to the arrangement shown in the above embodiment, and any type of apparatus can be used.

Furthermore, the thicknesses of the intermediate film, and the metal or metal compound film formed on the inner wall of the reaction tube prior to vapor growth on the substrate may be arbitrarily selected. If these films are too thin, they may be damaged when a film is formed thereon. However, if the films are excessively thick, stress may be to damage the films.

Various changes and modifications may be made without departing from the spirit and scope of the invention.

According to the present invention, since the intermediate film has good adhesion with both quartz, and the metal or metal compound film, the adhesion of quartz to the metal or metal compound film can be indirectly improved. Even if the metal or metal compound film is repeatedly grown on the respective substrates, the metal or metal compound film formed on the inner wall of the reaction tube will not peel off, thereby protecting the substrate surface from granular defects. In addition, as the metal or metal compound film is deposited on the reaction tube through the intermediate film prior to film formation on the substrate, the factors influencing the chemical reaction of the substrates will not change during the process, thereby allowing a uniform film thickness with good reproducibility to be obtained.

What is claimed is:

1. A method for forming a thin film of a metal or a metal compound on a substrate comprising Ge, GeAs, Si or sapphire, comprising the sequential steps of forming an intermediate film consisting of one of silicon or a metal silicide on an inner wall of a quartz reaction tube through a vapor growth method; then forming a film of the metal or metal compound other than that of said intermediate film on said intermediate film through a vapor growth method; and thereafter disposing said substrate in said reaction tube; and forming the thin film of the metal or metal compound by a vapor growth method on said substrate.

2. A method according to claim 1, wherein the metal silicide is a material selected from the group consisting of tungsten silicide, molybdenum silicide and titanium silicide.

3. A method according to claim 1, wherein said intermediate film comprises a two-layer structure having a first film of a material having good adhesion with quartz and a second film of a material having good adhesion with the metal or metal compound, said first film being sufficiently adhered to said second film.

4. A method according to claim 1, wherein the metal is a member selected from the group consisting of tungsten, molybdenum, tantalum, titanium and aluminum.

5. A method according to claim 1, wherein the metal compound is a member selected from the group consisting of tungsten silicide, molybdenum silicide, tantalum silicide and titanium silicide.

6. The method of claim 1 wherein said intermediate film consists of silicon.

7. The method of claim 6, wherein said metal is selected from the group consisting of tungsten, molybdenum, tantalum, titanium and aluminum.

8. The method of claim 6, wherein the metal compound is selected from the group consisting of tungsten silicide, molybdenum silicide, tantalum silicide and titanium silicide.

* * * * *